(12) United States Patent
Olynick et al.

(10) Patent No.: US 8,512,937 B2
(45) Date of Patent: Aug. 20, 2013

(54) LITHOGRAPHIC DRY DEVELOPMENT USING OPTICAL ABSORPTION

(75) Inventors: Deirdre Olynick, El Cerrito, CA (US);
P. James Schuck, Berkeley, CA (US);
Martin Schmidt, Berlin (DE)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/039,139

(22) Filed: Mar. 2, 2011

(65) Prior Publication Data

US 2011/0217655 A1   Sep. 8, 2011

Related U.S. Application Data

(60) Provisional application No. 61/310,629, filed on Mar. 4, 2010.

(51) Int. Cl.
*G03F 7/26* (2006.01)

(52) U.S. Cl.
USPC .......................................... 430/322; 430/394

(58) Field of Classification Search
USPC ................. 430/328, 322, 394, 323, 313, 311; 216/65, 66
See application file for complete search history.

(56) References Cited

U.S. PATENT DOCUMENTS

| | | | |
|---|---|---|---|
| 4,686,114 A * | 8/1987 | Halliwell et al. | 427/555 |
| 4,925,523 A * | 5/1990 | Braren et al. | 216/66 |
| 2004/0101790 A1 * | 5/2004 | Cauchi et al. | 430/394 |
| 2006/0127798 A1 * | 6/2006 | Ochiai et al. | 430/270.1 |
| 2007/0281247 A1 * | 12/2007 | Phillips et al. | 430/311 |

OTHER PUBLICATIONS

Yoshimoto et al., "A two-dimensional model of the deformation of photoresist structures using elastoplastic polymer properties", Journal of Applied Physics, vol. 96, No. 4, pp. 1858-1865, (Aug. 15, 2004).

Wu et al., "Extreme ultraviolet lithography: A review", Journal of Vacuum Science Technology B, vol. 25, No. 6, pp. 1743-1761, (Oct. 11, 2007).

Vertommen et al., "Integrated Silylation and Dry Development of Resist for sub-0.15um Top Surface Imaging Applications", Journal of Photopolymer Science and Technology, vol. 11, No. 4, pp. 597-612, (1998).

Wang et al., "Site-Selective Doping of Dyes into Polystyrene-block-Poly(4-vinyl pyridine) Diblock Copolymer Films and Selective Laser Ablation of the Dye-Doped Films", Japanese Journal of Applied Physics, vol. 46, No. 11, pp. 7569-7576, (Nov. 6, 2007).

(Continued)

*Primary Examiner* — Kathleen Duda
*Assistant Examiner* — Caleen Sullivan
(74) *Attorney, Agent, or Firm* — Lawrence Berkeley; National Laboratory

(57) ABSTRACT

A novel approach to dry development of exposed photo resist is described in which a photo resist layer is exposed to a visible light source in order to remove the resist in the areas of exposure. The class of compounds used as the resist material, under the influence of the light source, undergoes a chemical/structural change such that the modified material becomes volatile and is thus removed from the resist surface. The exposure process is carried out for a time sufficient to ablate the exposed resist layer down to the layer below. A group of compounds found to be useful in this process includes aromatic calixarenes.

16 Claims, 4 Drawing Sheets

(56) References Cited

OTHER PUBLICATIONS

Yamaguchi et al., "Negative Tone Dry Development of Si-Containing Resists by Laser Ablation", Japanese Journal of Applied Physics, vol. 34, No. 12B, Part 1, pp. 6800-6804, (Oct. 19, 1995).

Oteyza et al., "Sub-20 nm laser ablation for lithographic dry development", Nanotechnology, vol. 23, pp. 1-6, (Apr. 13, 2012). http://researcher.watson.ibm.com/researcher/view_project_subpage.php?id=3662.

* cited by examiner

Methyl acetoxy calixarene

T-butyl acetoxy calixarene

Wet Developed in Xylenes

Dry Developed by Laser

LITHOGRAPHIC DRY DEVELOPMENT USING OPTICAL ABSORPTION

CROSS REFERENCE TO RELATED APPLICATIONS

This application claims priority to Provisional U.S. Patent Application No. 61/310,629 filed on Mar. 4, 2010, entitled Lithographic Dry Development Using Optical Absorption, a copy of said earlier application incorporated herein as if fully set forth in its entirely.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

1. Field of the Invention

This invention relates generally to lithographic development of photo resist materials and, more specifically a new method and class of compounds for dry development and processing of photoresist using laser based optical absorption and ablation.

2. Description of the Related Art

Lithography has become an important tool in semiconductor manufacturing, especially in the removal such as by etching or the deposition of certain materials onto a supporting wafer, from which individual chips will eventually be formed. Generally, a resist material is first placed on a wafer as a blanket coating across the wafer surface. This can be done in any one of several ways, one of the most widely used methods being the spin on of resist coatings, usually a polymer, dissolved in a solvent so that it is in liquid form. Thereafter, with the wafer coated with resist, it is subject to a lithographic step where the resist is subject to exposure to a light/energy source, such as EUV or visible light. In the usual case the light/energy source is projected through a lithographic mask to create an exposure pattern on the resist, the wafer subject to numerous exposure steps in order to fully expose the wafer surface. The resist itself undergoes a chemical change in the areas where exposure has occurred, to change the solubility of the material. The exposure is repeated until the entire surface of the wafer has been exposed. Commonly a stepper will be employed, the tool providing for the precision movement of the wafer from one position to another so that with each exposure an adjacent but non overlapping area of the wafer is exposed.

In the lithography process both positive and negative resists are used. For positive resists, the resist is exposed with light projected through a mask, the mask containing an exact copy of the pattern to remain on the wafer. Thus, only in the exposed areas, where the underlying material is to be removed does the exposure change the chemical structure of the resist such that it becomes more soluble in the developer. The exposed resist is then washed away using the developer solution, exposing the underling material. The wafer is then subject to further processing, be it etch or deposition.

For a negative resist, the materials behave in the opposite manner. Exposure to light causes the negative resist to further polymerize, thus making it less soluble in the developer. Therefore the negative resist will remain on the surface of the wafer wherever it has been exposed, and the development solution will remove the resist only in the unexposed areas. Thus, masks used with negative resists contain the inverse (i.e. the photographic negative) of the pattern to be transferred.

One particularly useful method for patterning very small, nano-scale features, employs an electron beam writer instead of stepper to create the desired patterns. Here, the resist is put on in the traditional manner. Instead, however, of using a mask to transfer a pattern, an electron beam is used to "write" the pattern onto the substrate by moving the e-beam across the resist in the areas to be patterned. This maskless approach has found particular utility in the making of the lithographic masks themselves, which masks are then used in EUV/visible light lithography processes. In yet another e-beam approach, a broad e-beam is used, much like with EUV, where the e-beam is projected through a mask to expose the resist in those areas struck by the beam.

No matter the approach, the resist is chemically changed as the result of the exposure to the energy source, be it UV light or e-beam, the resulting exposure causing a change in the solubility of the resist. In a next step, the resist is washed away using a solvent, the resist remaining on the substrate where exposed (in the case of a negative resist) or washed away where exposed (in the case of a positive resist). Thereafter, the remaining resist can be hardened, for instance by heating, before a final washing step is performed, all of this prepatory to subsequent etching or deposition. These processes are well known and are not further described herein.

As features have gotten smaller and smaller and aspect ratios higher and higher, problems have arisen relating to pattern collapse as a result of the steps used to remove the resist. It has been reported, in fact, in the case of very small features having high aspect ratios, that the mere capillary (i.e. surface tension) forces of the liquid solvent within the trenches of the resist generated during the drying process is sufficient to cause pattern wall collapse. As feature sizes continue to shrink, resist collapse has been found to occur at smaller and smaller aspect ratios and for features 50 nm or less, it can happen at aspect ratios less than 2. For more on this phenomenon, see K. Yoshimoto, P. Stoykovich, H. B. Cao, J. J. de Pablo, P. F. Nealey, and W. J. Drugan, J. Appl. Phys. 96, 1857 (2004), or the review discussing challenges for EUV lithography by B. Wu and A. Kumar, J. Vac. Sci. Technol. B, 25, 1743 (2007).

To address this problem, several solutions have been proposed. One such suggested approach is directed to reducing the capillary pressures acting on the exposed resist, such as by drying using lower surface tension solvents, supercritical drying, or freeze drying, as well as using surfactants to lower capillary forces. Still other approaches have been directed to improving the photoresist's mechanical properties, such as by increasing the Young's modulus of the photo resist polymer.

Still other approaches to overcoming this phenomenon have included dry development such as reported by Vertommen, J. K., A. Klippert, W. Goethals, A.-M. Van Roey, F. in Integrated Silylation and Dry Development of Resist for Sub 0.15 m, Top Journal of Photopolymer Science and Technology, 1998, Vol. 11; Number 4, pages 597-612. In this chemical approach, silicon containing gases are introduced to the wafer where they react with the photoresist film (a silylation step) either where exposed or unexposed. The silicon containing gases render the material less volatile in a subsequent plasma etching process. While the capillary forces encountered in the wet process are thus avoided, gas diffusion has been a problem with this dry process. Resolution has been found to be limited due to lowering of the glass transition temperature, swelling, and high line edge roughness.

Notwithstanding these attempts to deal with the problem of pattern collapse, there remains a need for a simple, repeatable process which avoids structure collapse, while at the same time providing high resolution results.

SUMMARY OF THE INVENTION

By way of this invention a novel dry blanket exposure approach is used to develop the resist, which, in one embodiment, where exposed forms a volatile compound which volatilizes or ablates from the resist surface. The invention is also directed to a novel class of compounds which form a volatilization product when a change in chemical structure is induced by exposure to an energy source such as a laser light source.

More particularly, according to an embodiment of the invention, a broad beam light source is used to dry develop or blanket expose a resist with high resolution. In one embodiment, the light source may be a visible light source, in another embodiment a laser light source. The material that is being dry developed needs to be responsive to the optical frequency of the light source such that it absorbs energy to undergo chemical change, where the changed material becomes volatile. In another embodiment, for a laser light source, using appropriate power settings, the laser light source, can be used to selectively ablate resist materials in areas that have been pre-exposed by electron beam lithography, or other high resolution lithography, such as EUV lithography. By pre exposure to high resolution radiation, chemical changes to the material are initiated to the point that when the resist is next exposed to the broad beam light source, volatilization rapidly initiates. In still another embodiment, the use of laser development may be combined with wet development techniques, with the benefit of a reduction in the development time that is required in the high resolution tool. As an additional benefit to laser development, a negative resist when developed in solvent can become positive when developed by laser

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1:
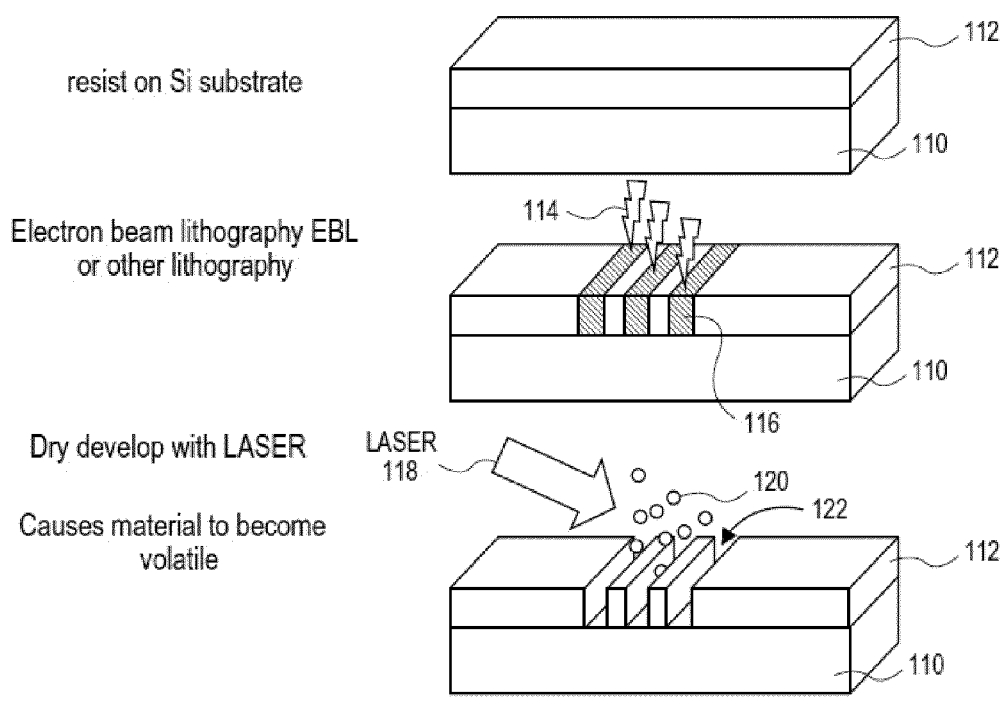
FIG. 1 is an illustration of a development process according to an embodiment of the invention.

With reference to FIG. 1, according to one process of this invention, a resist layer 112 is first deposited onto a substrate 110 which can be a wafer. Thereafter the resist layer is exposed to a high resolution radiation 114 which may be provided according to an electron beam lithography process, an EUV lithography or other lithography process. In the illustration shown, the exposed areas have been designated as areas 116. In the next dry development step, the resist/wafer combination is exposed to a visible light source 118, which in one embodiment may be a laser light source. The resist material 112, already having been chemically changed in the exposed areas 116, ablates (item 120) under the influence of the light source, the ablation process continued until the resist material is removed down to underlying substrate 110 to form the desired patterned features 122.

According to an embodiment of the invention, it has been found that at least one group of resist materials can be dry developed using a laser light, and more particularly, in one embodiment, a continuous wave 532 nm wavelength (visible light) laser. The laser can also be pulsed. In addition, the laser can be used to give a low resolution exposure dose which can be followed with high resolution radiation exposure dose and still be selectively developed using the resist in the high resolution areas.

Most generally, it has been found that any class of conjugated polymers may potentially be used as a resist in this ablation/volatilization process, so long as the polymer is either in liquid form at application temperatures, or is dissolvable in a solvent such that it may be applied as a thin film to a wafer. Further, it must be responsive to the optical frequency of the light source such that where the polymer is exposed it undergoes a chemical change.

In one embodiment, a suitable class of resist materials include those which under the influence of a high resolution energy source (such as e-beam, EUV exposure, or alternatively a field confined laser beam using plasmonics), undergo a chemical change (such as through further conjugation or creation of a light absorbing moiety), whereby its absorptive response to visible light is materially changed in those areas where exposed, to produce a volatility contrast between those areas where the resist has been exposed, and those areas where not. Suitable materials exhibiting these characteristics include conjugated molecules such as aromatic polymers.

Figure 2:
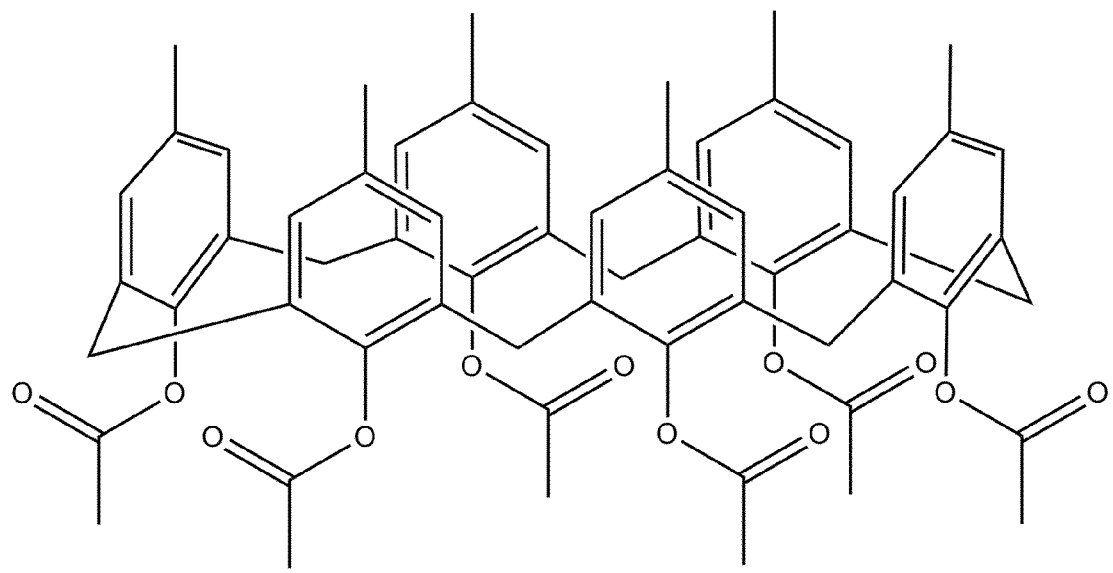
FIGS. 2 and 3 are pictorial representations of exemplary calixarenes which may be used as a resist material according to an embodiment of the processes of this invention.
Figure 3:
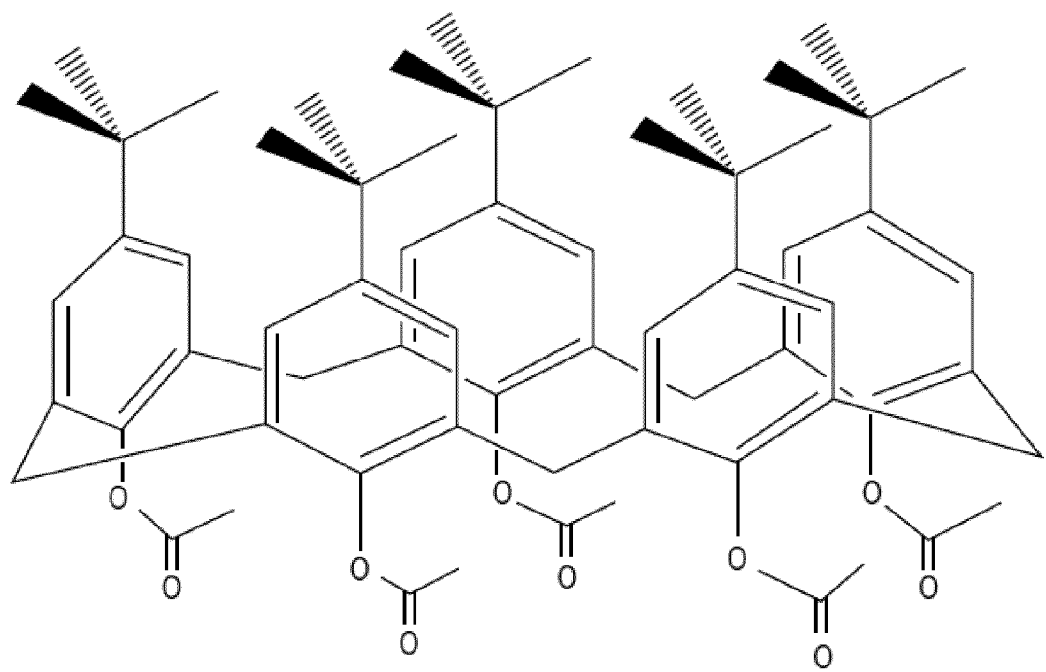

Within this class, we have further found a group of compounds known as calixarenes to be useful, especially calixarenes such as methyl acetoxy calixarene, t-butyl acetoxy calixarene, and methyl acetoxy calixarenes substituted with a moiety selected from the group comprising halo, cyano, and nitro. These calixarenes (cyclic oligomers) comprise a class of compounds based on the hydroxyalkylation product of a phenol and an aldehyde. Exemplary representations of such acetoxy calixarenes are illustrated in FIG. 2 and FIG. 3. This class of calixarene compounds, in addition to their optical properties, has been found to be particularly suitable for the processes of this invention, in that they are easily dissolved in a casting solvent for deposition on planar surfaces, but can be used as well without the need for a casting solvent.

Generally any class of compounds can be used if they can be applied to a substrate, e.g. a wafer, using already existing tools. In addition these compounds must be capable of undergoing chemical change in response to light energy and become volatile under continued exposure. While not intending to be bound by the following, it is believed that exposure of the compound to a light source causes the compound to decompose such that the fragments are easily volatilized, and essentially ablate from the surface of the exposed resist. Finally, the resist can be comprised of a mixture of one or more of the above identified resist materials such a mixture of a polymer and conjugated molecules.

Figure 4:
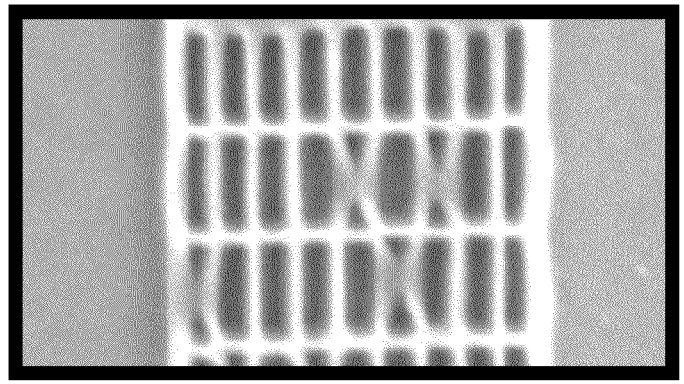
FIG. 4 are photographs of the results of both a wet development and a dry development of a structure according to the processes of this invention, illustrating one of the advantages of the instant dry process.
Figure 4:
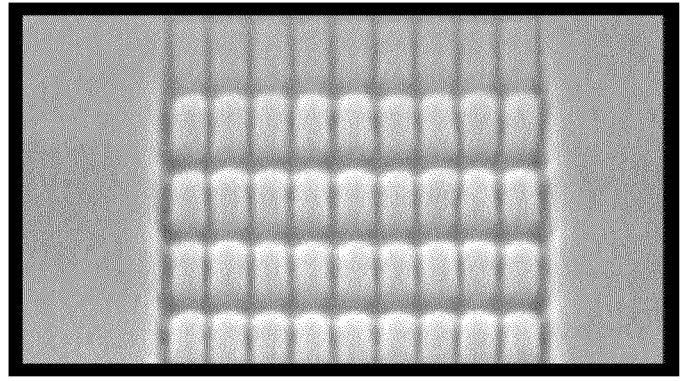

Illustrative of one of the advantages of the present process is the comparison in FIG. 4 showing structures obtained using a wet development process with xylene, and the dry development process by laser according to one aspect of this invention. As observed in the upper photograph, wall/feature collapse can easily be seen, while no such wall collapse is evident according to the instant dry development process.

As heretofore noted, e-beams have been used with or without masks to write very fine patterns onto a resist layer. Where the patterns are to be serially drawn, after a long exposure for a time $t_1$, the resist can be subject to prior art wet or dry processes used to address pattern collapse. With e-beam exposure alone, however, unacceptably long exposure times in the order, for example of 0.5 years would be required to write a 300 mm wafer with a dose of 20 mC/cm$^2$, at 1 nA current. Thus, today, as a practical matter only small areas are exposed to make a mask and these areas are replicated over and over.

By use of the lasers and resist materials according to the invention, the efficiency of the process is greatly improved, even when using e-beam exposure as an initial step. Thus, in an alternative embodiment, combining e-beam exposure with exposure of the resist layer to visible light, the resist coated substrate can be first subject to high resolution e-beam exposure for a relatively short period of time $t_2$, to thus partially expose the resist, where $t_2 < t_1$. The resist can then be subject to further exposure to light, in one embodiment a laser light for an additional time $t_3$, using the same mask, to finish the exposure.

As a further advantage such as in the case of calixarenes, we have found that the modulus of the calixarene material can be increased, to thus facilitate more traditional wet development using conventional approaches. Using such modified calixarenes, after an exposure to light energy for a time $t_3$, one can follow a wet development process. Alternatively, to continue with a dry process, the exposure can be carried out for an additional amount of time $t_4$ (for a total exposure time of $t_3+t_4$), whereby that the calixarene is further converted such that it becomes volatile and in effect sublimes/ablates in those areas of exposure.

In addition to being able to process the wafer without encountering pattern collapse, the efficiency of the process is increased due to the reduction in total processing time. Thus, the amount of exposure time $t_{2(e-beam)}+t_3+t_4$ is still substantially less than $t_1$. By way of example, $t_1$ might equal 12 hours, while $t_2+t_3+t_4$ might collectively be 7 hours. Further time savings can also be realized by reducing laser exposure times by simply increasing the power of the laser beam used for the exposures.

The lasers used in this process are generally low power, continuous wavelength lasers in the UV/visible light range. In experiments performed, we have used a 532 nm CW laser with a maximum power of 30 mW, and a power density of between 1 to 14 megawatts (MW) per cm$^2$. Particularly useful are lasers in the visible light range where the absorption differences between exposed and non exposed areas results in the high volatility contrasts. Other visible light wavelength lasers would be expected to perform just as well.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A process for lithographic development comprising:
   (i) depositing a layer of a resist material on a substrate, wherein the resist material comprises an amount of conjugated groups and has a first absorption coefficient to a light source having a wavelength above 400 nm;
   (ii) exposing a region of the resist material to a source of high-resolution radiation to increase the amount of conjugated groups resulting in a second absorption coefficient to the light source which is greater than the first absorption coefficient;
   (iii) exposing the resist material to the light source, the difference between the second absorption coefficient of the region exposed to the high-resolution radiation and the first absorption coefficient of an unexposed region results in a high volatility contrast, wherein the region first exposed to the high-resolution radiation and then further exposed to the light source is volatilized.

2. The process of claim 1 wherein the light source is a laser light source.

3. The process of claim 2 wherein the laser light source is a 532 nm wavelength laser.

4. The process of claim 3 wherein the laser light source is operated at a power density of between 1 MW/cm2 and 14 MW/cm2.

5. The process of claim 1 wherein the source of high-resolution radiation is an electron beam.

6. The process of claim 1 wherein the source of high-resolution radiation is extreme ultra violet light.

7. The process of claim 1 wherein the conjugated resist material comprises aromatic groups.

8. The process of claim 1 wherein the resist material comprises a calixarene.

9. The process of claim 8, wherein the calixarene comprises an aromatic OH.

10. The process of claim 8, wherein the resist is substituted with a group selected from the group consisting of halo, cyano, and nitro.

11. The process of claim 1 wherein the resist material can be a mixture of materials.

12. The process of claim 1 wherein the exposure is a patterned exposure.

13. The process of claim 12 wherein the pattern is created using a mask interposed between the source of the high resolution radiation, and the layer of resist material.

14. The process of claim 1 wherein the substrate is in the form of a wafer.

15. The process of claim 1 wherein the wafer is a silicon wafer.

16. A dry lithography process in which:
   i) a resist layer is first deposited on a substrate, wherein the resist material comprises an amount of conjugated groups and has a first absorption coefficient to a laser having a wavelength above 400 nm;
   ii) the resist layer is exposed to an electron high resolution radiation beam to pattern the resist to increase the amount of conjugated groups resulting in a second absorption coefficient to the laser which is greater than the first absorption coefficient; and,
   iii) the patterned resist is thereafter dry developed with the laser to volatilize the resist in the areas of exposure wherein the difference between the second absorption coefficient of the region exposed to the high-resolution radiation and the first absorption coefficient of an unexposed region results in a high volatility contrast.

* * * * *